United States Patent [19]

Valentine

[11] Patent Number: 4,574,266
[45] Date of Patent: Mar. 4, 1986

[54] ELECTRICAL LOAD MONITORING SYSTEM AND METHOD

[75] Inventor: Richard J. Valentine, Mesa, Ariz.

[73] Assignee: Motorola, Inc., Schaumburg, Ill.

[21] Appl. No.: 503,961

[22] Filed: Jun. 13, 1983

[51] Int. Cl.[4] ................... B60Q 1/00; G08B 29/00; G08B 21/00

[52] U.S. Cl. .................. 340/52 F; 340/516; 340/641; 340/642

[58] Field of Search ........... 340/635, 638, 639, 640, 340/641, 642, 644–654, 516, 52 R, 52 F; 73/117.3; 307/10 R, 10 LS; 315/82, 83

[56] References Cited

U.S. PATENT DOCUMENTS 3,944,889  3/1976  Conway .................. 340/641 X
4,447,801  5/1984  Masuda .................. 340/52 F

OTHER PUBLICATIONS

Scharf, F. J.; "Automotive Lamp Outage Detection"; Society of Automotive Engineers; National Automobile Engineering Meeting, Detroit, Michigan, May 22–26, 1972.
McNamee, J. & Marshall, B.; "Electronic Lamp Monitoring"; SAE Spring Conference, May 22, 1972.
Automotive Electronics II; IEEE and SAE; Feb. 1975, p. 31.

Primary Examiner—James L. Rowland
Assistant Examiner—Daniel Myer
Attorney, Agent, or Firm—William J. Kubida; Dale E. Jepsen

[57] ABSTRACT

A microcomputer controlled monitoring system and method for detecting an electrical open, shorted or operative condition of an electrical load. A load switch circuit couples the load to a common voltage line and is controlled by a single drive line from a microcomputer controlled load monitor circuit.

4 Claims, 6 Drawing Figures

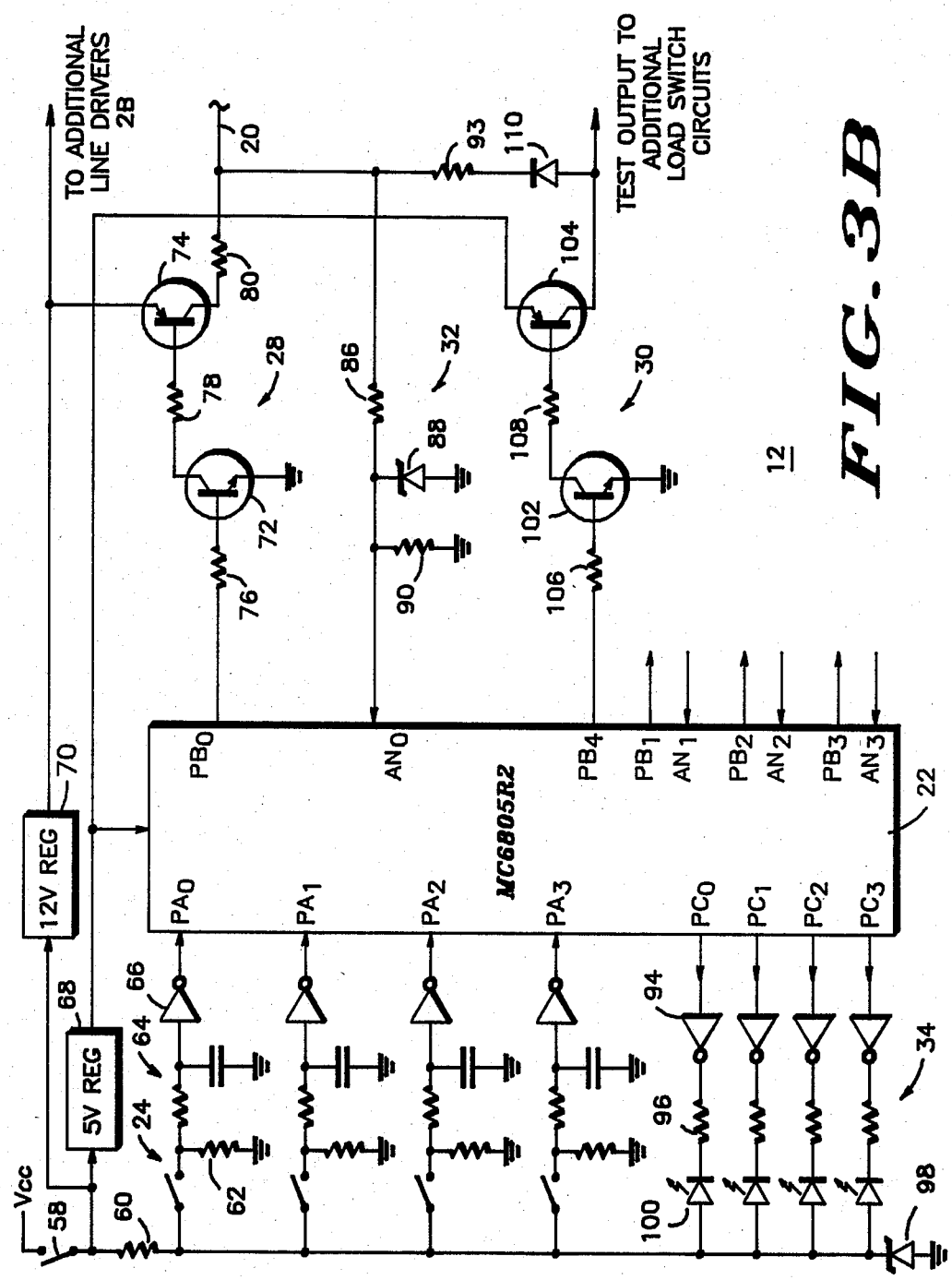

ELECTRICAL LOAD MONITORING SYSTEM AND METHOD

BACKGROUND OF THE INVENTION

The present invention relates, in general, to the field of electrical load monitoring systems and methods. More particularly, the present invention relates to a system and method of especial utility in the monitoring of the operating condition of various automotive electrical devices and for providing an indication of a device's operating condition to an operator located remotely therefrom utilizing a single electrical conductor.

Numerous applications exist for a system for monitoring the operating condition (open, shorted or operational) of an electrical device or load at a position remote therefrom, particularly in an automobile. In such a situation, there are obvious safety considerations in apprising the vehicle operator of the operational condition of the multitude of electrical devices on the vehicle, the condition of which can neither be directly observed nor repeatedly checked such that appropriate maintenance might be performed or a redundant device switched in.

To this end, various monitoring techniques have been hitherto proposed. The earliest of such systems involved the use of reed relays which would be closed by the electromagnetic force produced by the current drawn by an electrical load such as a lamp. In the event of a lamp failure, the reed relay would open a switch, resulting in an indication to the vehicle operator on the vehicle dash. A description of some typical reed relay systems is contained in a paper presented by F. J. Scharf to the Society of Automotive Engineers at the National Automobile Engineering Meeting in Detroit, Mich. on May 22-26, 1972 entitled "Automotive Lamp Outage Detection". Among the problems inherent in the use of reed relays are those noted in a paper presented by James McNamee and Brad Marshall at the same meeting entitled "Electronic Lamp Monitoring", such as lack of uniformity of the relays, tight tolerances on the proximity of the relays to the harness assemblies, and vibration in the automobile. Other obvious disadvantages include the expense inherent in the utilization of reed relays, the complexity of the wiring they necessitate, the fact that the relay cycles each time the load is switched on and the susceptibility of the system to voltage variations.

Another method of monitoring lamps has involved the use of phototransistors. Such light sensitive solid-state devices detect the actual presence of light at the respective lamps to be monitored. In such a system, the signals from each lamp are then brought to a common switch which can control the operation of an on-dash indicator. However, this system is also unsatisfactory because of the expense involved, the difficulty encountered in device placement in proximity to the monitored lamp, the inability to detect a single filament failure in a dual filament lamp and the need for calibration of the devices to various lamp types.

In light of the deficiencies inherent in the phototransistor approach, a fiber optic lamp monitoring system has also been proposed. In such a monitoring system, a plastic or glass fiber which transmits light by internal reflection is used which functions by physically conducting the light from a lamp to a jewel lens visible to the vehicle operator. Such a system results in a positive function indication, rather than an actual lamp outage detection. However, as with the phototransistor method, only a load which produces light can be monitored and only with respect to whether the device is either open or operational. No indication of a shorted condition can be provided.

Other systems include those employing a sensor such as a voltage comparator which compares the voltage drop of a vehicle's left side lamps to that of the right side lamps. This type of electronic circuit requires multiple subcircuits in order that all exterior lamps may be monitored. However, although many vehicle lamps may be monitored, the system is inherently expensive, susceptible to high frequency noise and requires a complex wiring harness to implement. An alternative electronic sensor approach involves the sensing of a load voltage drop which detects the difference between the drop for one lamp versus the electrical voltage drop for two lamps in the same circuit. However, once again the wiring harness required to implement such a system is relatively complex and results in a reduced voltage to the vehicle lamps which are to be monitored. Moreover, resistors or special vehicle wiring may also be required.

A further outage indicator system has been described in Automotive Electronics II published in February 1975 by the Society of Automotive Engineers at page 31. This system, which was proposed exclusively for stop lamps, involved the use of a high frequency oscillator connected between the stop lamp bulb and an inductor in series with the lamp switch. Should the lamp be burned out, a high frequency voltage is generated at the point of connection of the high frequency oscillator and the high frequency current flows through the inductor. This current flow provides an electrical input to light up an indicator lamp to alert the vehicle operator.

Overall, the aforementioned approaches are all relatively expensive to implement in terms of the numerous interconnecting wires they require between the monitored load and the indicator as well as in the way they function to sense current through the monitored load. The number of wires required in a vehicle wiring harness is a major consideration in system implementations and is the reason a multiplexed system approach is being adapted in the industry. Moreover, in using multiple-wire wiring harnesses, numerous connectors are necessitated thus introducing more failure prone points in the systems. Still further, with the systems above described, no differentiation is made between an operative or shorted condition of the monitored load and only an electrical open or operating condition may be sensed.

SUMMARY OF THE INVENTION

It is therefore an object of the present invention to provide an improved electrical load monitoring system and method.

It is further an object of the present invention to provide an improved electrical load monitoring system and method which may be economically implemented utilizing existing components.

It is still further an object of the present invention to provide an improved electrical load monitoring system and method which allows for detection of a load failure on the load drive line.

It is still further an object of the present invention to provide an improved electrical load monitoring system and method which minimizes interconnecting wiring between an electrical load and a load status indicator.

The foregoing and other objects are achieved in the present invention wherein there is provided a monitoring system and method for detecting an electrical condition of a remote electrical load connected to a voltage source line. A load switching circuit having a drive line input thereto couples the load to a common voltage line. A load monitor circuit located remotely from the load switching circuit has a drive line output thereof connected to the drive line input of the load switching circuit. The load monitor circuit provides a test signal to the load switching circuit and thereafter detects a response thereto.

The load monitor system of the present invention alerts the user of a potential safety hazard or nuisance failure of an electrical load operating with a power MOSFET based load switch circuit and a microprocessor based load monitor circuit. The microprocessor is programmed to determine the output status of the load at a regular interval and also whenever the load is switched on or off. The basis of the load monitor system of the present invention is a MOSFET detector utilized to monitor the low, or "switched" side of the load and to apply a test current from a low voltage source into the drive line. This test current is monitored to see whether it raises the drive line to the test current's supply voltage or whether the test current is shunted to a common voltage line by means of the MOSFET detector. The microprocessor will then indicate a load failure if the load has opened. When the power MOSFET switch is switched on and a short has occurred in the load, the microprocessor will again indicate a load failure.

BRIEF DESCRIPTION OF THE DRAWINGS

The above mentioned and other features and objects of the present invention and the manner of attaining them will become more apparent and the invention itself will be best understood by reference to the following description of an embodiment of the invention taken in conjunction with the accompanying drawings, wherein:

FIG. 3B is a respresentative logic flow diagram of a load monitor circuit for use in the load monitor system of FIG. 1 utilizing an analog/digital (A/D) I/O microcomputer.

DESCRIPTION OF A PREFERRED EMBODIMENT

Figure 1:
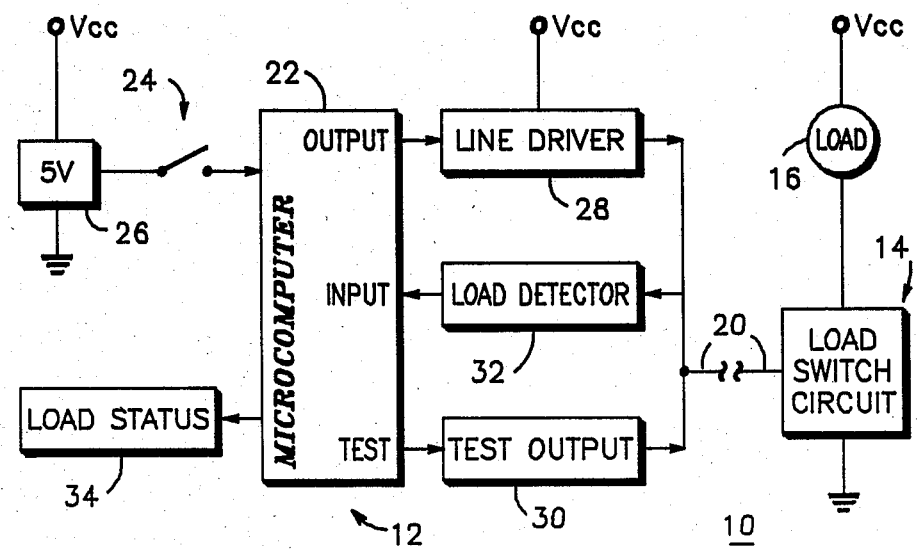
FIG. 1 is a simplified logic flow diagram of a load monitor system in accordance with the present invention illustrative of the interconnecting drive line and general functional aspects thereof.

With reference now to FIG. 1, a simplified logic flow diagram of a load monitor system 10 in accordance with the present invention is shown. Load monitor system 10 comprises, in pertinent part, a load monitor circuit 12 as connected to a remote load switch circuit 14 by means of drive line 20. As shown, load switch circuit 14 will be located in proximity to load 16 and is interconnected to load monitor circuit 12 by means of a single conductor drive line 20.

Load 16, which may be a lamp or other electrical load, is directly connected to a source of voltage, $V_{CC}$, and is switchably coupled to circuit ground by means of load switch circuit 14. A source of $V_{CC}$ is also applied to five-volt source 26 for input to microcomputer 22 of load monitor circuit 12. Five-volt source 26 may be a simple resistive voltage divider for use with a $V_{CC}$ source of approximately 12 volts. Input switch 24 allows for the turning "on" or "off" of load 16 as will be more fully described hereinafter. An output of microcomputer 22 is applied to the input of line driver circuit 28 having another input thereof connected to a source of $V_{CC}$. The output of line driver circuit 28 is applied to drive line 20 for input to load switch circuit 14. Microcomputer 22 also furnishes a test output to test output circuit 30 having its output similarly connected to drive line 20. A load detector circuit 32 having its input connected to drive line 20 provides an input signal to microcomputer 22. An additional output of microcomputer 22 is supplied as an input to load status circuit 34 for providing a visual indication of the status of load 16 or instituting the implementation of a redundant circuit in substitution for load 16 in the event of its failure. When utilized as a failure indicator, load status circuit 34 may comprise a conventional LED or other visual or auditory indication to an operator that a failure condition of load 16 has been detected by load monitor system 10.

Figure 2A:
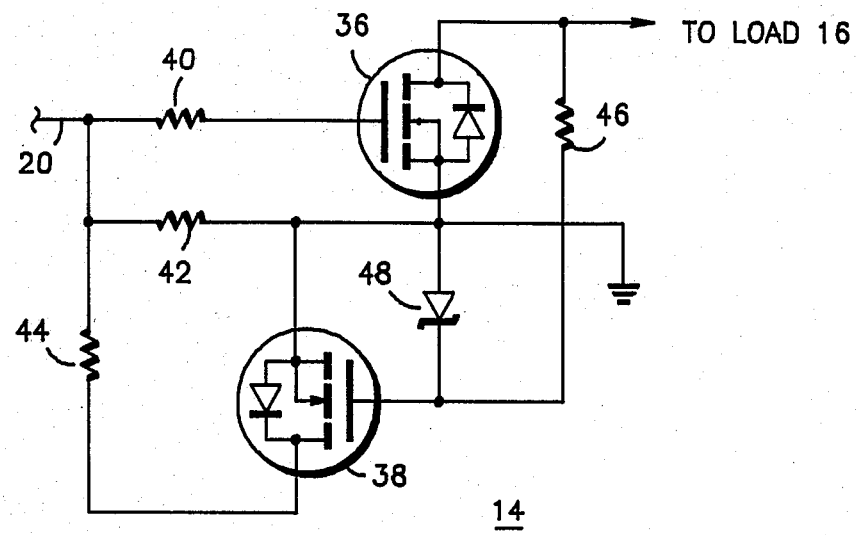
FIG. 2A is a representative schematic illustrative of a load switch circuit for use in the load monitor system of FIG. 1.

Referring additionally now to FIG. 2A, a load switch circuit 14 for use in a load monitor system 10 is shown. Drive line 20 is connected through resistor 40 to the gate terminal of power MOSFET switch 36. The drain terminal of power MOSFET switch 36 is connected to one terminal of load 16, which terminal is also connected through resistor 46 to the gate terminal of MOSFET detector 38. The source terminals of power MOSFET switch 36 and MOSFET detector 38 are connected to circuit ground as is the anode of zener diode 48 having its cathode connected to the gate terminal of MOSFET detector 38. Drive line 20 is also connected to circuit ground through resistor 42, as well as through resistor 44 to the drain terminal of MOSFET detector 38. It should be noted that power MOSFET switch 36 will be a relatively large device capable of handling the current drawn by load 16 and having a threshold voltage of approximately three volts. MOSFET detector 38 may be a relatively smaller device having a threshold voltage of approximately 1.5 volts. While MOSFET detector 38 may be an integrated device, it may be possible to integrate all of load switch circuit 14 including power MOSFET switch 36. As shown, power MOSFET switch 36 and MOSFET detector 38 may be a TMOS ™ device available from Motorola Inc., assignee of the present invention. Such TMOS ™ devices incorporate an internal shunt diode between the source and drain terminal thereof. It should also be noted that zener diode 48 may be unnecessary should the source of $V_{CC}$ in a load monitor system 10 be sufficiently regulated.

Figure 2B:
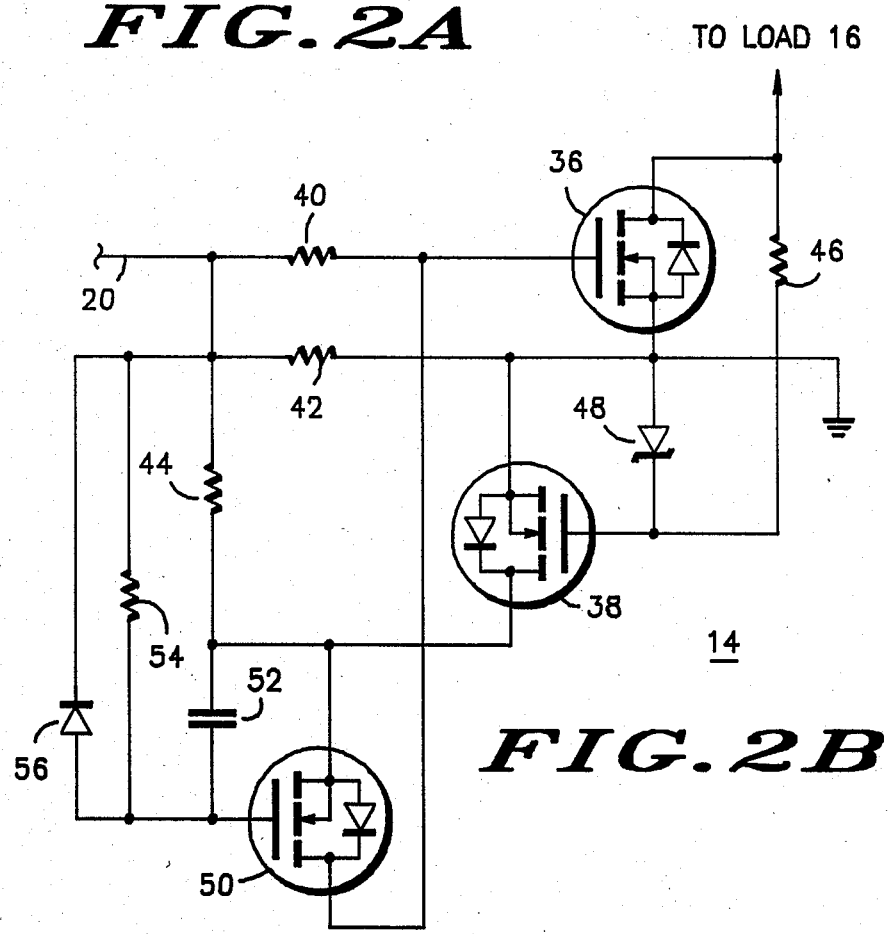
FIG. 2B is a representative schematic illustrative of an alternative embodiment of a load switch circuit for use in the load monitor system of FIG. 1 which provides for a shorted load protective circuit for the power MOSFET switch.

Referring additionally now to FIG. 2B, an alternative embodiment for load switch circuit 14 is shown and like structure to that of FIG. 2A is like numbered. In this embodiment, a timer MOSFET 50 has its source terminal connected to the drain terminal of MOSFET detector 38 and its drain terminal connected to the gate of power MOSFET switch 36. The gate of timer MOSFET 50 is coupled to drive line 20 through parallel connected resistor 54 and diode 56. The gate terminal of timer MOSFET 50 is also connected to the drain of MOSFET detector 38 through capacitor 52. Timer MOSFET 50 may also be a TMOS ™ device and functions to protect power MOSFET switch 36 from drawing excessive power in the event load 16 is shorted. With resistor 54 having a value of approximately 100K ohms and capacitor 52 having a value of approximately 0.05 microfarads, a sufficient time delay is incorporated to allow load 16 to stabilize such that a determination may be made by timer MOSFET 50 as to whether load 16 is intact or shorted. In the event of a shorted load 16, timer MOSFET 50 will turn off power MOSFET switch 36 preventing excessive power consumption.

Figure 3A:
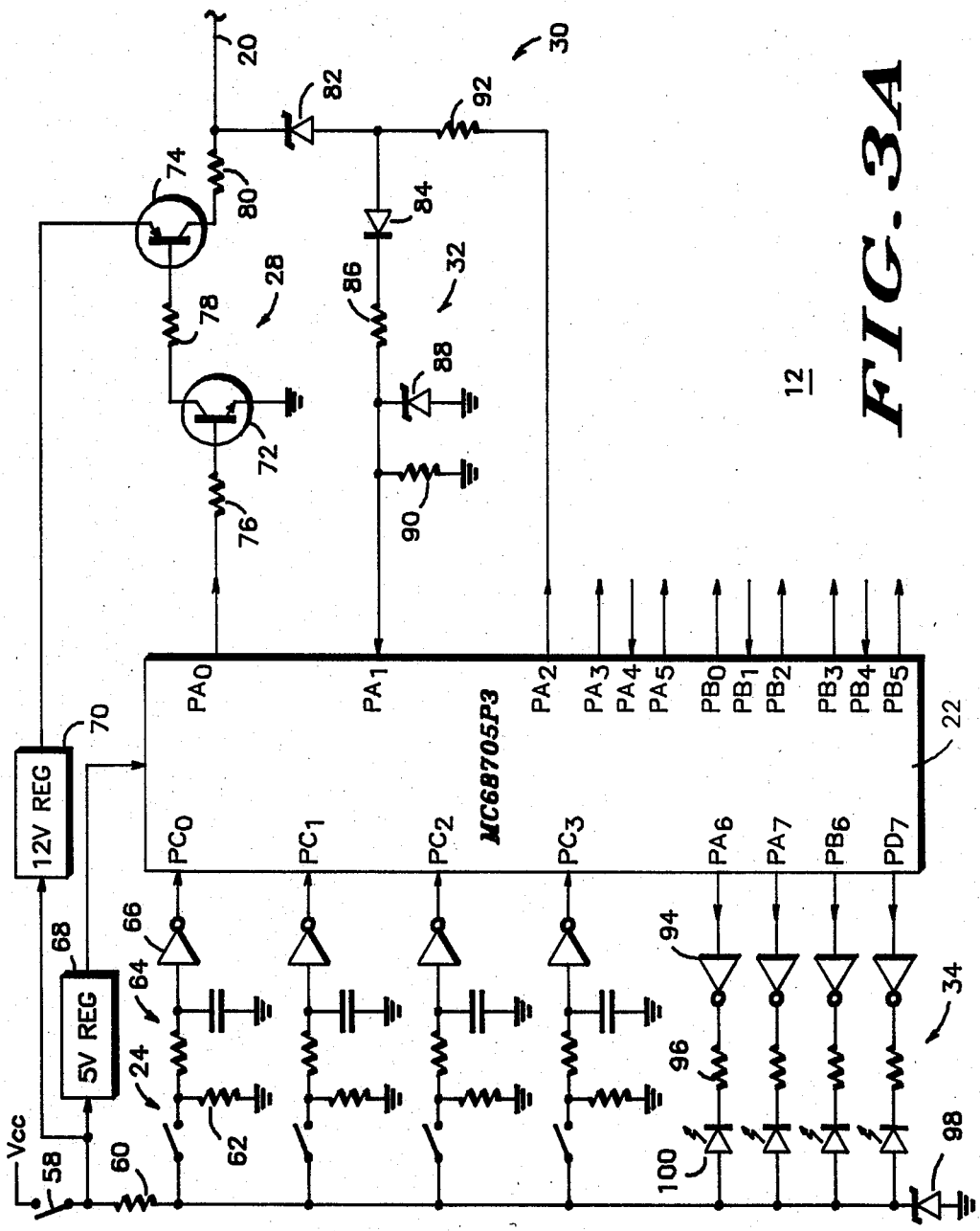
FIG. 3A is a representative logic flow diagram of a load monitor circuit for use in the load monitor system of FIG. 1 utilizing a conventional digital input/output (I/O) microcomputer.

Referring additionally now to FIG. 3A, a load monitor circuit 12 for use with the load switch circuit 14 of FIGS. 2A and 2B is shown. Load monitor circuit 12 comprises in major part a microcomputer 22 which may be furnished as a Motorola MC68705P3 unit or other similar microcomputer device. A source of regulated five volts is supplied to microcomputer 22 from five volt regulator 68 having its input switchably connected to $V_{CC}$ through master switch 58. Master switch 58 also furnishes a source of $V_{CC}$ through resistor 60 to the cathode of zener diode 98 having its anode connected to circuit ground. A plurality of input switches 24 connect the cathode of zener diode 98 to a resistor 62 thereby forming a voltage divider in combination with resistor 60. The output of the voltage divider comprising resistor 60 and 62 is applied to the input of a contact debounce circuit 64, which may comprise a conventional RC low pass filter, for input to inverter 66. The output of inverter 66 is supplied as an input to microcomputer 22 at one port thereof.

Load status circuit 34, as shown, may comprise a plurality of LED's 100 for giving an indication of a failure condition of load 16. Load status circuit 34 is taken at an output of microcomputer 22 through an inverter 94 for application to a resistor 96 connected to the cathode of LED 100. The anode of LED 100 is connected to the cathode of zener diode 98. In this manner, an output of microcomputer 22 appearing at the input of load status circuit 34 will cause a visual indication of a failure of a load 16 by illumination of LED 100.

A line driver circuit 28 of load monitor circuit 12 is shown as connected to one output of 12-volt regulator 70 having its input connected to a source of $V_{CC}$ through master switch 58. Input to line driver circuit 28 is taken at an output port of microcomputer 22 which is connected to the base terminal of NPN transistor 72 through resistor 76. The emitter of NPN transistor 72 is connected to circuit ground while its collector terminal is connected to the base terminal of PNP transistor 74 through resistor 78. The emitter terminal of PNP transistor 74 is connected to the output of 12-volt regulator 70 while its collector terminal is connected to drive line 20 through resistor 80.

An input signal to microcomputer 22 is taken from load detector circuit 32 as shown. Load detector circuit 32 comprises, in pertinent part, series connected diode 84 and resistor 86 as coupled to circuit ground through parallel connected zener diode 88 and resistor 90. The anode of diode 84 is connected to drive line 20 through zener diode 82. Zener diode 82 functions to connect test output circuit 30, comprising in this instance resistor 92, to drive line 20. Resistor 92 is connected to a test output of microcomputer 22.

Referring additionally now to FIG. 3B, an alternative embodiment of load monitor circuit 12 is shown for use with a microcomputer 22 having A/D inputs such as a Motorola MC6805R2 or similar unit. In the description of the embodiment of load monitor circuit 12 of FIG. 3B, like structure to that above described with respect to FIG. 3A is like numbered and the foregoing description thereof shall suffice as the description hereof. In this embodiment, test output circuit 30 comprises in pertinent part, NPN transistor 102 and PNP transistor 104. The base of NPN transistor 102 is connected to an output of microcomputer 22 through resistor 106. The emitter of NPN transistor 102 is connected to circuit ground while its collector is connected through resistor 108 to the base of PNP transistor 104. The emitter of PNP transistor 104 is connected to the output of five-volt regulator 68 while its collector provides additional test outputs for other load switch circuits in a load monitor system 10 for monitoring a plurality of loads 16. The collector of PNP transistor 104 is connected through series connected diode 110 and resistor 93 to drive line 20. Drive line 20 is connected directly to resistor 86 of load monitor circuit 32, which in this embodiment need not comprise diode 84 and zener diode 82. The emitter of PNP transistor 74 provides an additional output to other line drivers 28 in a load monitor system 10 for monitoring a plurality of loads 16.

In operation, if load 16 is intact, a bias voltage from $V_{CC}$ through load 16 and resistor 46 will be placed on the gate of MOSFET detector 38 which, due to its approximately 1.5 volt threshold voltage, will turn the device on. If a test voltage from microprocessor 22 is applied to test output circuit 30 while MOSFET detector 38 is on, the input port to microprocessor 22 at the output of load detector circuit 32 will be sensing the voltage drop across resistor 92 (or resistor 93) ratioed with resistor 44 of load switch circuit 14. Essentially then, drive line 20 will be pulled to ground through resistor 44. Should load 16 be in an open condition, MOSFET detector 38 will not be biased on and the output of load monitor circuit 32 will sense the voltage across resistor 92 (or 93) ratioed with that of resistor 42. Therefore, drive line 20 will be high.

As can be seen, the closure of input switch 24 causes microcomputer 22 to supply an output signal thereby enabling line driver 28. Line driver 28 applies a source of $V_{CC}$ to the gate of power MOSFET switch 36 causing it to turn on thereby coupling load 16 to circuit ground causing its activation. If MOSFET detector 38 is on, the output of line driver circuit 28 is divided equally across resistors 80 and 44, which, when using a $V_{CC}$ source of 12 volts, will apply six volts to the gate of power MOSFET switch 36. This is sufficient to turn on the device which allows it to lower the voltage appearing on its drain thereby turning off the bias on MOSFET detector 38. Thus, the gates of power MOS- FET switch 36 and MOSFET detector 38 will pull up to the level of $V_{CC}$. This $V_{CC}$ level on drive line 20 is then dropped across zener diode 82 in the embodiment of FIG. 3A sufficient to cause a logic 1 to appear at the output of load detector circuit 32.

Should load 16 be shorted or otherwise draw too much current, power MOSFET switch 36 will pull out of its ON condition and start dropping voltage again. When the voltage drop across the device goes beyond the threshold of MOSFET detector 38, it will turn on and load down drive line 20 again. When drive line 20 goes below the voltage level of zener diode 82, a logic zero will be input to microcomputer 22 from the output of load detector 32.

Figure 4:
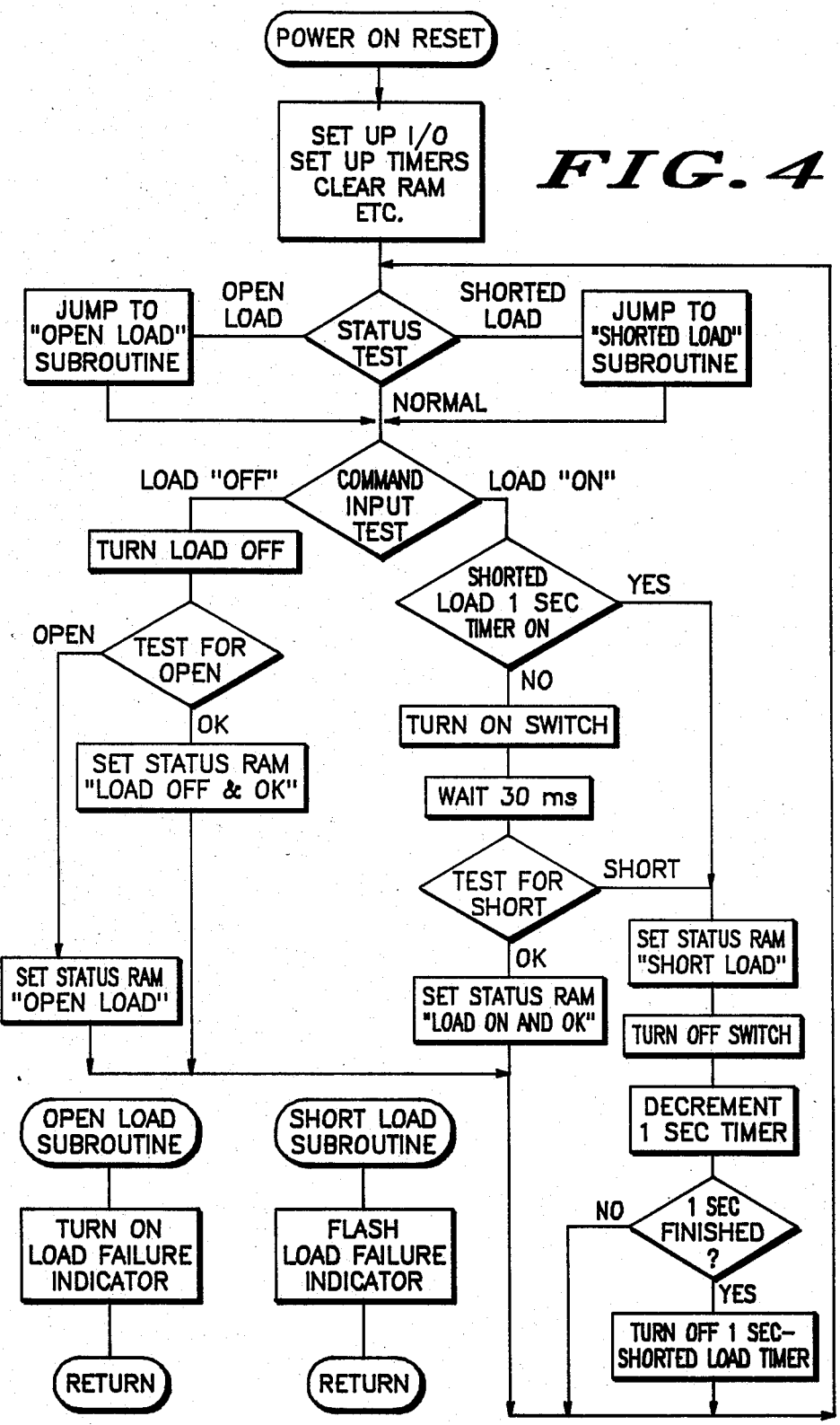
FIG. 4 is a flow chart illustrating the possible programming of the microcomputer of the load monitor circuits of FIGS. 3A and 3B for determining the output status of an electrical load at a regular interval and during a power-up or power-down sequence.

Referring additionally now to FIG. 4, a logic flow chart for a possible software implementation of load monitor system 10 is shown for use with the load monitor circuits 12 of the FIGS. 3A and 3B. On closure of master switch 58 or upon closure of any one of input switches 24, the status of the switches can be scanned by microcomputer 22 to detect whether or not a load 16 should be turned on. Prior to turning on load 16 a check is done to make sure this part of the logic loop has not been gone through before. A thirty millisecond wait is built into the system which is roughly the time it takes for a load 16 in the form of a lamp to heat up and stabilize. At this point, the load 16 is tested for a short. Should a short be detected, a branch to the short load subroutine is initiated and load 16 is switched off. After a one-second wait, the timer is decremented one time and the program branches around to go through the loop again to again test for a shorted condition of load 16. Upon switching the load off, a test for an open condition is initiated at which point the program would branch to an open load subroutine.

SYSTEM OPERATION

With reference specifically to a load monitor system 10 utilizing the load monitor circuit 12 of FIG. 3A and the load switch circuit 14 of either FIGS. 2A or 2B, the following tabular representation of the system operational parameters pertain:

| Input Switch 24 | Load 16 Status | Test Port | Input Port | Drive Line 20 | Program Result |
|---|---|---|---|---|---|
| Off | Intact or Short | Off (ØV) | 0 (ØV) | ØV (510Ω to com) | No test in progress |
| Off | Intact or Short | On (5V) | 0 (.52V) | .52V | Load intact or shorted |
| Off | Open | On (5V) | 1 (3.3V) | 3.3V | Open load |
| On | Normal | Off (ØV) | 0→1 (4.7V) | 6→12V | Normal load "on" 30MS voltage delay |
| On | Shorted | Off (ØV) | 0 (ØV) | 6V | Shorted load |
| On | Open | Off (ØV) | 1 (4.7V) | 12V | Same as Normal load except the first few MS does not lower drive voltage to 6V. | where $V_{CC} = 12$ volts; resistors 44 and 80 are 510 ohms; resistor 42 = 30K ohms; resistor 92 = 3K ohms; resistors 86 and 90 are 1K and 100K respectively; and zener diodes 82 and 88 are rated at 8.6 volts and 4.7 volts respectively.

With reference specifically to a load monitor system 10 utilizing the load monitor circuit 12 of FIG. 3B and the load switch circuit 14 of either FIG. 2A or 2B, the following tabular representation of the system operational parameters pertain:

| Input Switch 24 | Load 16 Status | Test Port | A/D Input Port | Drive Line 20 | Program Result |
|---|---|---|---|---|---|
| Off | Intact or Short | Off (ØV) | ØV | ØV (1KΩ to com) | No test in progress |
| Off | Intact or Short | On (4.3V) | 0.135V | .37V | Load intact or shorted |
| Off | Open | On (4.3V) | 1.43V | 2.86V | Open load |
| On | Normal | Don't care | 3→04.7V | 6→12V | Normal load "on" 30MS voltage delay |
| On | Shorted | Don't care | 3V | 6V· | Shorted load |
| On | Open | Don't care | 4.7V | 12V | Open | where $V_{CC} = 12$ volts; resistors 44 and 80 are 1K ohms; resistor 42 = 20K ohms; resistor 93 = 10K ohms; resistors 86 and 90 are 100K ohms; and zener diode 88 is rated at 4.7 volts.

It should be noticed that a load monitor system 10 utilizing the digital I/O circuitry of FIG. 3A cannot detect a shorted load 16 as readily as the A/D load monitor circuit 12 of FIG. 3B. By use of an appropriate value for zener diode 82 however, a shorted load condition can be detected. By use of timer MOSFET 50 as shown in FIG. 2B, an additional hardware protection for power MOSFET switch 36 may be utilized in addition to the software program protection for switching off a load 16 in the event a short is detected.

What has been provided therefore is an improved electrical load monitoring system and method which may be economically implemented utilizing existing components. The improved electrical load monitoring system and method of the present invention allows for detection of a load failure on the load drive line and minimizes interconnecting wiring between an electrical load and a load status indicator.

While there have been described above the principles of the invention in conjunction with specific apparatus, it is to be clearly understood that this description is made only by way of example and not as a limitation to the scope of the invention.

I claim:

1. A method for detecting an electrical condition of a remote electrical load connected to a source voltage line comprising the steps of:
   coupling said load to a common voltage line by means of a load switching circuit having a drive line input thereto;
   connecting a load monitor circuit at a drive line output thereof to said drive line input of said load switching circuit by means of a drive line;
   providing a test signal at said drive line output; and
   detecting a response from said load switching circuit on said drive line in response to said test signal.

2. The method of claim 1 further comprising the step of:
   activating said electrical load by means of an SPST switch connected to an input of a microcomputer wherein said step of providing is carried out by means of said microcomputer.

3. The method of claim 1 further comprising the step of:
   indicating a failure condition of said electrical load.

4. The method of claim 1 further comprising the step of:
   furnishing a shorted load protective circuit for said load switching circuit.

* * * * *